(12) United States Patent
Terada et al.

(10) Patent No.: US 6,269,209 B1
(45) Date of Patent: Jul. 31, 2001

(54) RESIN SEALED OPTICAL MODULE

(75) Inventors: Koji Terada, Kawasaki; Taizo Nosaka, Komaki; Goji Nakagawa, Kawasaki; Kazuhiro Tanaka, Kawasaki; Kazunori Miura, Kawasaki; Yoshihiro Yoneda, Kawasaki; Akira Fukushima, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/127,599

(22) Filed: Jul. 31, 1998

(30) Foreign Application Priority Data

Jan. 8, 1998 (JP) .................................................. 10-002092

(51) Int. Cl.⁷ ...................................................... G02B 6/26
(52) U.S. Cl. ................................. 385/51; 385/45; 385/49; 385/51; 385/88; 385/89; 385/92; 385/94; 174/256; 174/260; 257/783; 257/792
(58) Field of Search ................................. 385/14, 45, 51, 385/88, 89, 92, 94, 49; 361/534; 257/783, 792; 445/24; 174/256, 260

(56) References Cited

U.S. PATENT DOCUMENTS

| | | |
|---|---|---|
| 3,911,475 | 10/1975 | Szedon et al. . |
| 4,001,655 | 1/1977 | Voyles et al. . |
| 4,717,948 | 1/1988 | Sakai et al. . |
| 4,758,875 | 7/1988 | Fujisaki et al. . |
| 4,803,543 | 2/1989 | Inayoshi et al. . |
| 4,948,960 | * 8/1990 | Simms et al. .................... 250/227.11 |
| 5,130,780 | 7/1992 | Kumai et al. . |
| 5,185,835 | * 2/1993 | Vial et al. ................................ 385/49 |
| 5,825,951 | * 10/1998 | Kitamura ................................ 385/45 |

FOREIGN PATENT DOCUMENTS 2207559  8/1990  (JP) .

* cited by examiner

*Primary Examiner*—Cassandra Spyrou
*Assistant Examiner*—Craig Curtis
(74) *Attorney, Agent, or Firm*—Staas & Halsey LLP

(57) ABSTRACT

An optical module including a substrate, an optical waveguide formed on the substrate, and an optical element mounted on the substrate so as to be optically coupled to an end of the optical waveguide, for performing conversion between light and electricity. The optical module further includes a transparent resin for covering at least an optical coupling portion between the optical waveguide and the optical element, and a thermoplastic resin for covering only the optical element and its periphery including the transparent resin to seal the optical element.

8 Claims, 5 Drawing Sheets

RESIN SEALED OPTICAL MODULE

BACKGROUND OF THE INVENTION

1. Field of the Invention

The present invention relates to an optical module and a sealing method therefor.

2. Description of the Related Art

In recent years, the development of an optical access network has been actively pursued. For realization of an optical access network, it is greatly important to reduce the cost of an optical device and/or an optical module. Also in sealing an optical element for performing opto-electric conversion or electro-optic conversion in an optical module, further cost reduction is required, and a method of easily sealing the optical element with a sufficient reliability is demanded.

In many optical modules at present, a metal package or ceramic package is used to ensure reliability and the package is hermetically sealed by welding or soldering, resulting in a very high cost of optical module. For cost reduction of an optical module, it is now important to simplify the sealing method for an optical element. As an example of simplification of the sealing method for an optical element, there has been proposed a method of applying a resin to the entire surface of a substrate on which an optical element is mounted and next curing the resin (Mitsuo Fukuda et al., "Plastic Packaging of Semiconductor Laser Diode", Electronic Components and Conference, 1996, pp1101–1108).

In the case of applying a resin to the entire surface of a substrate on which an optical element is mounted and next curing the resin to seal the optical element as described in the above literature, there is a possibility that separation or cracking of the resin may occur because of a large difference in coefficient of thermal expansion between the substrate and the resin, or the substrate may be broken by a residual stress in the resin. The larger the thickness of the resin coating covering the optical element and the wider the range of spread of the resin coating, the larger the residual stress in the resin. Accordingly, the residual stress can be relaxed by thinly applying the resin to a minute area surrounding the optical element. However, the resin is generally in the form of gel, so that when dropped onto the substrate, it spreads widely on the substrate and it is difficult to apply the resin to only the minute area surrounding the optical element.

SUMMARY OF THE INVENTION

It is therefore an object of the present invention to provide a low-cost high-reliability optical module by sealing only an optical element and its periphery with a resin.

It is another object of the present invention to provide a sealing method for a low-cost high-reliability optical module.

In accordance with an aspect of the present invention, there is provided an optical module comprising a substrate; an optical waveguide formed on said substrate and having a first end; an optical element mounted on said substrate so as to be optically coupled to said first end of said optical waveguide, for performing conversion between light and electricity; a transparent resin for covering at least an optical coupling portion between said optical waveguide and said optical element; and a thermoplastic resin for covering only said optical element and its periphery including said transparent resin to seal said optical element.

In accordance with another aspect of the present invention, there is provided an optical module comprising a substrate; an optical waveguide formed on said substrate and having a first end; an optical element mounted on said substrate so as to be optically coupled to said first end of said optical waveguide, for performing conversion between light and electricity; and an ultraviolet-curing resin for covering only said optical element and its periphery including an optical coupling portion between said optical waveguide and said optical element to seal said optical element.

In the optical module according to the present invention, only the optical element and its periphery are sealed with the resin, so that the residual stress in the resin can be reduced. Therefore, separation and cracking of the resin can be prevented to thereby ensure the cost reduction and reliability of the optical module.

In accordance with a further aspect of the present invention, there is provided a sealing method for an optical module including an optical waveguide formed on a substrate and having a first end, and an optical element mounted on said substrate so as to be optically coupled to said first end of said optical waveguide, for performing conversion between light and electricity, comprising the steps of applying a transparent resin to an optical coupling portion between said optical waveguide and said optical element; curing said transparent resin; applying a thermoplastic resin to only said optical element and its periphery; and curing said thermoplastic resin by cooling to thereby seal said optical element.

In accordance with a still further aspect of the present invention, there is provided a sealing method for an optical module including an optical waveguide formed on a substrate and having a first end, and an optical element mounted on said substrate so as to be optically coupled to said first end of said optical waveguide, for performing conversion between light and electricity, comprising the steps of applying an ultraviolet-curing resin to the entire surface of said substrate; laying a mask having an opening for exposing said optical element and its periphery over said substrate at a given height; directing ultraviolet radiation through said mask onto said ultraviolet-curing resin to thereby cure only a part of said ultraviolet-curing resin exposed to said opening; removing said mask; and removing the remaining uncured part of said ultraviolet-curing resin by using an organic solvent.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
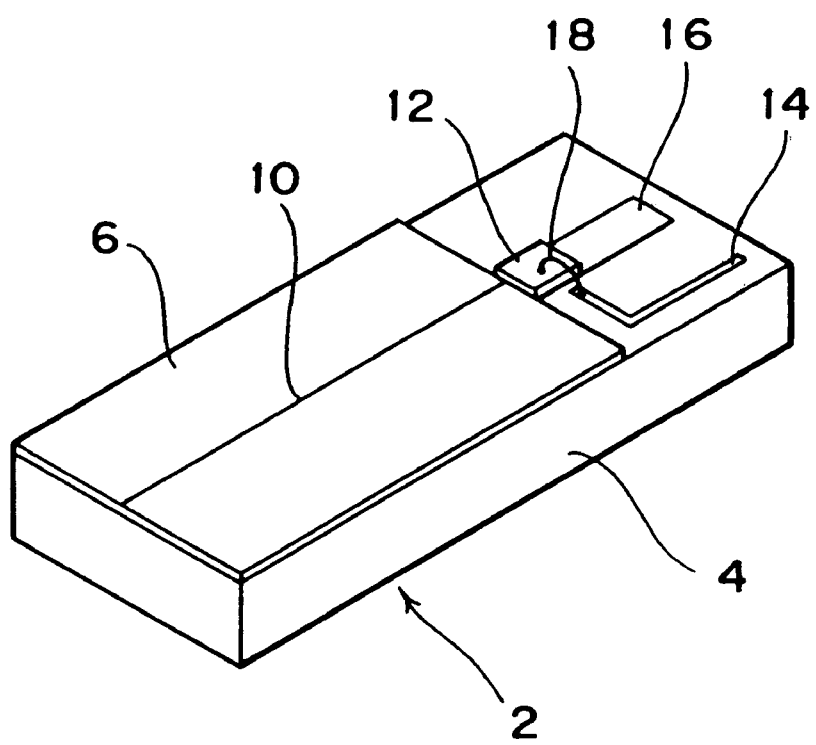
FIG. 1 is a perspective view of a laser diode module.

Referring to FIG. 1, there is shown a perspective view of a laser diode module (LD module) 2 suitable for sealing of a laser diode by a sealing method according to a first preferred embodiment of the present invention. An SiO₂ glass layer 6 is formed on an Si substrate 4 by a CVD process, for example. An optical waveguide 10 doped with germanium (Ge) or titanium (Ti), for example, is formed in the SiO₂ glass layer 6. A laser diode (LD) 12 is mounted on the substrate 4 so as to be opposed to an end of the optical waveguide 10. Reference numerals 14 and 15 denote feed electrodes for the LD 12. The feed electrode 14 is connected to the LD 12 by bonding through a gold wire 18.

Figure 2:
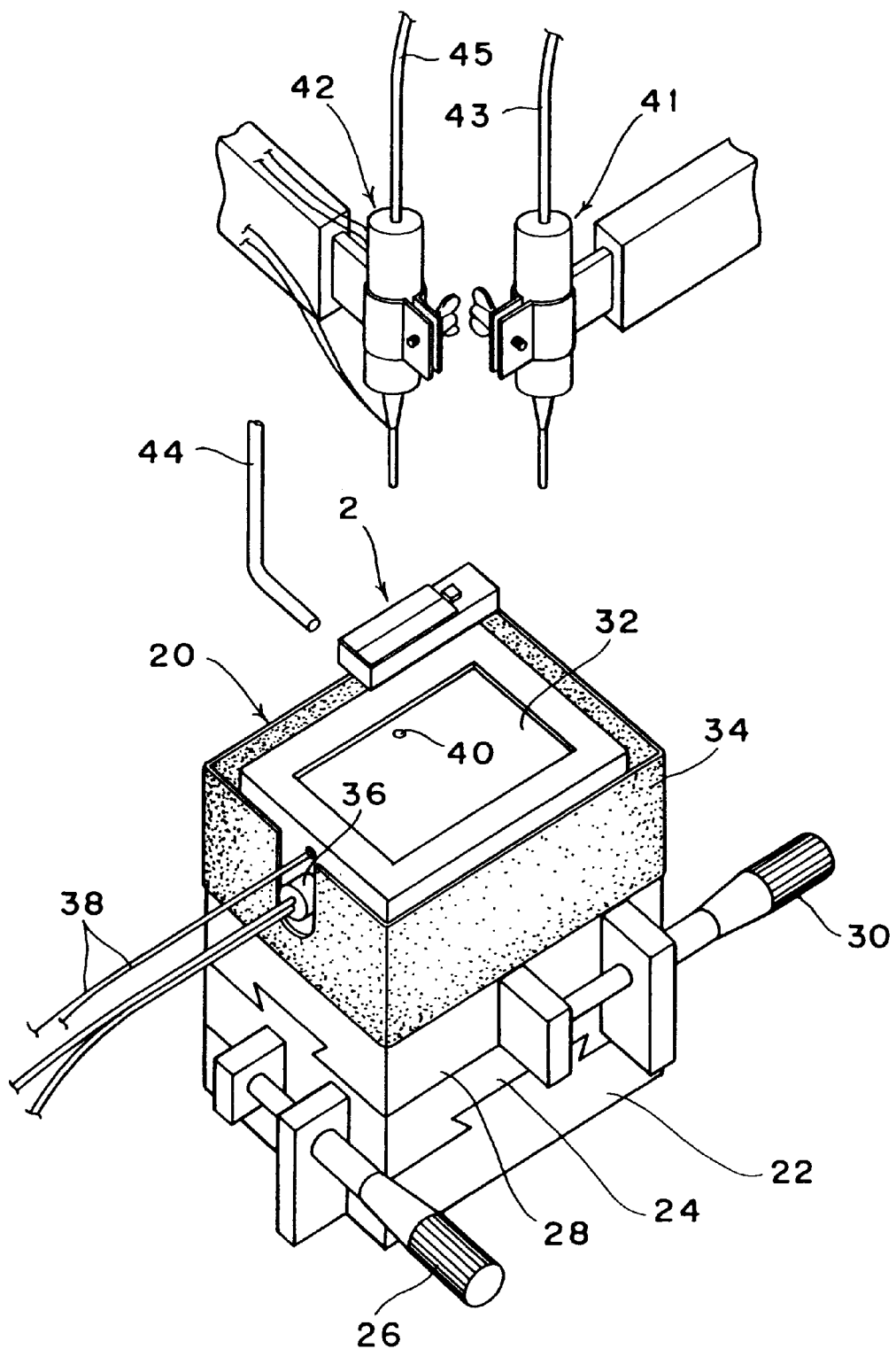
FIG. 2 is a perspective view showing a general configuration of an apparatus used for resin sealing according to the present invention.

Referring to FIG. 2, there is shown a general configuration of an apparatus used for resin sealing according to the present invention. Reference numeral 20 denotes a stage assembly for mounting the LD module 2. The stage assembly 20 includes a base 22, an X table 24 movable in an X-axis direction on the base 22, and a Y table 28 movable in a Y-axis direction on the base 22. By rotating a knob 26, the X table 24 is moved in the X-axis direction on the base 22, whereas by rotating a knob 30, the Y table 28 is moved in the Y-axis direction on the base 22.

A stage 32 is mounted on the Y table 28. A sheath heater 36 is inserted in the stage 32, and the temperature of the stage 32 can be measured by a thermocouple 38. The stage 32 is surrounded by a protective cover 34. The stage 32 is formed with a vacuum hole 40 for attraction of the LD module 2 under vacuum. Reference numeral 41 denotes a dispenser containing a silicone resin. The dispenser 41 is provided with a hose 43 connected to a compressed air source (not shown). Reference numeral 42 denotes a hot dispenser containing a thermoplastic resin. The hot dispenser 42 is provided with a hose 45 connected to a compressed air source (not shown). Reference numeral 44 denotes a cooling air blowing nozzle.

Figure 3:
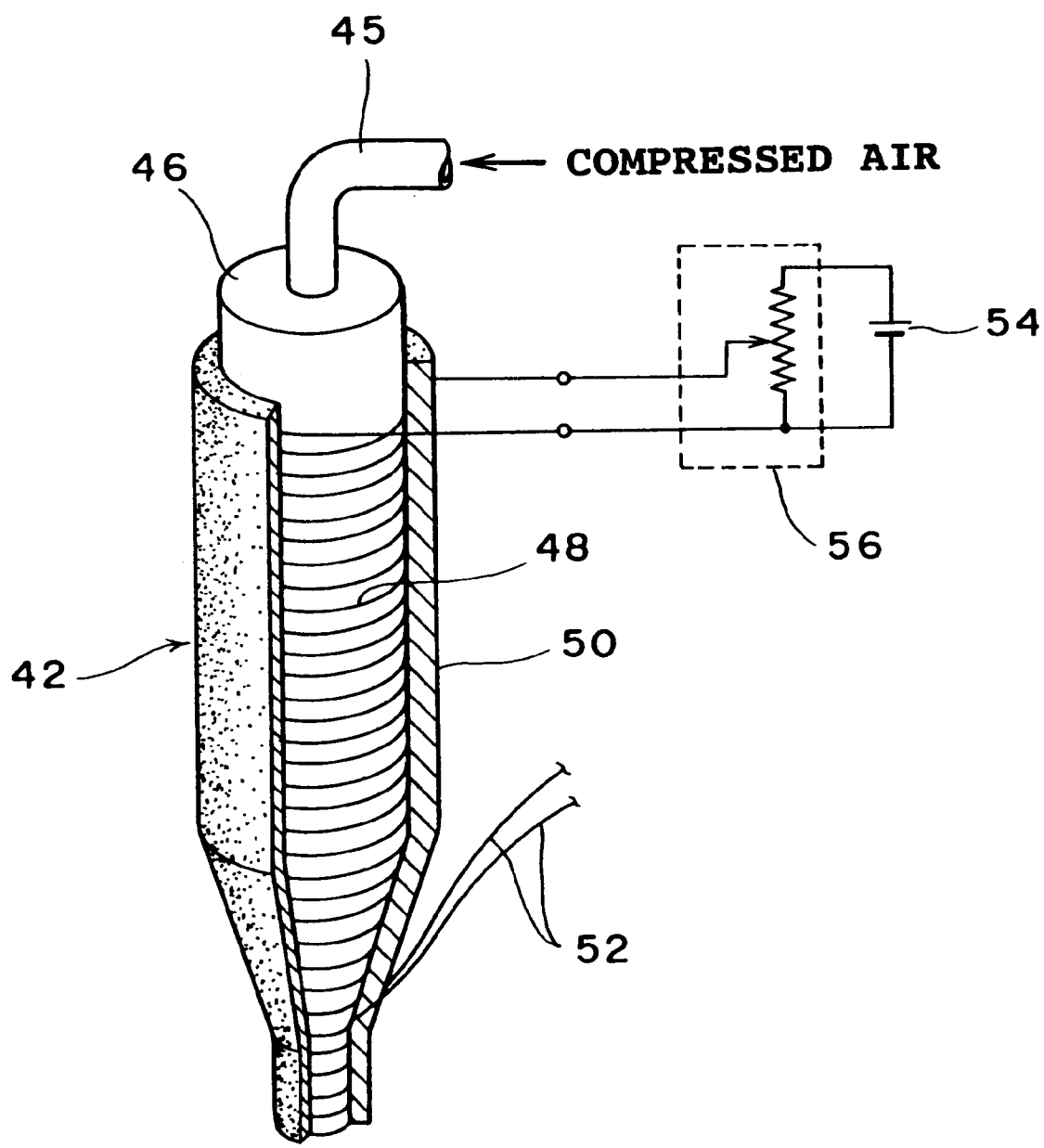
FIG. 3 is a partially cutaway, perspective view of a hot dispenser.

Referring to FIG. 3, there is shown a partially cutaway, perspective view of the hot dispenser 42. The hot dispenser 42 has a plastic container 46 in which the thermoplastic resin is contained. A preferred example of the thermoplastic resin is Staystick 383, a trade name of Alphametals Inc., USA. The common name for Staystick 383 is polyoxyether. A Nichrome wire 48 is wound around the plastic container 46. The Nichrome wire 48 is connected through a Variac 56 to a power source 54. By adjusting the Variac 56, a current flowing in the Nichrome wire 48 is controlled to thereby adjust the temperature of the container 46. The Nichrome wire 48 is covered with a heat insulator 50. The temperature of the container 46 is measured by a thermocouple 52.

The LD module 2 is placed on the stage 32, and adjacent two sides of the LD module 2 are made to abut against adjacent two sides of a recess formed on the upper surface of the stage 32 to thereby position the LD module 2 just over the vacuum hole 40. Then, the LD module 2 is fixed to the upper surface of the stage 32 by suction through the vacuum hole 40. The stage 32 is next heated to about 150° C. by the heater 36. This temperature of 150° C. is a curing temperature of the silicone resin as a thermosetting resin, and is also a curing temperature of the Staystick 383 as a thermoplastic resin.

Figure 4:
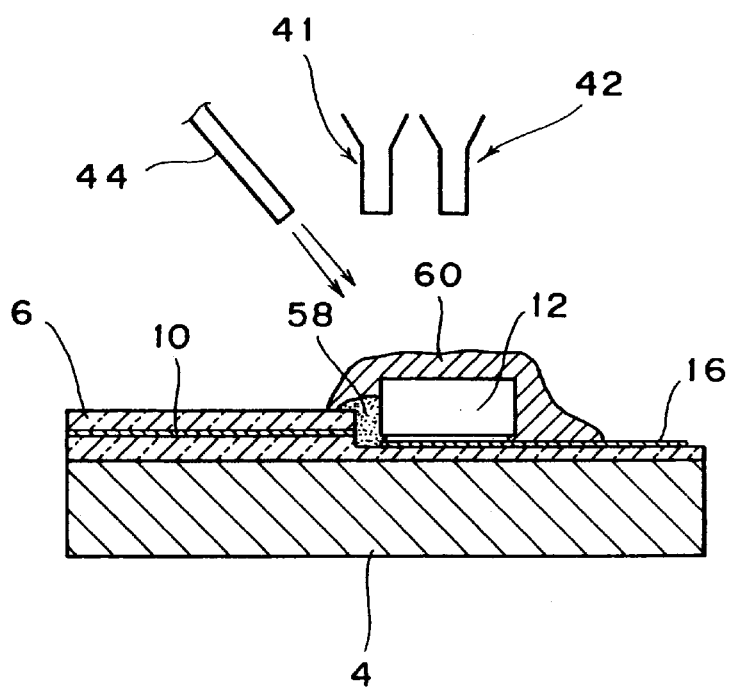
FIG. 4 is a sectional view of the laser diode module after resin sealed.

Then, the X table 24 and the Y table 28 are moved to adjust the position of the LD module 2 mounted on the stage 32 so that an optical coupling portion between the optical waveguide 10 and the LD 12 comes to a position just under the dispenser 41. Thereafter, the silicone resin is dropped from the dispenser 41 to a gap between the optical waveguide 10 and the LD 12, thereby filling the gap as shown by reference numeral 58 in FIG. 4. Because the stage 32 is heated at about 150° C., the silicone resin 58 dropped is cured in the gap. Accordingly, the optical coupling portion between the LD 12 and the optical waveguide 10 is filled with the cured silicone resin 58 which is transparent, thus ensuring an optical path between the LD 12 and the optical waveguide 10.

In the next step, the X table 24 and the Y table 28 are moved again to adjust the position of the LD module 2 mounted on the stage 32 so that the LD 12 comes to a position just under the hot dispenser 42. In the case that Staystick 383 is used as the thermoplastic resin, the temperature of the lowermost end of the hot dispenser 42 is preferably set to about 200° C. In this case, the temperature of the container 46 is adjusted to about 230° C. to about 240° C. by adjusting the current flowing in the Nichrome wire 48. The higher the temperature of the hot dispenser 42, the lower the viscosity of Staystick 383 as the thermoplastic resin contained in the hot dispenser 42, thereby allowing smoother dropping of the thermoplastic resin. However, an excessive increase in temperature of the hot dispenser 42 is not preferable because the resin becomes turbid in yellow.

After thus relatively positioning the hot dispenser 42 to the stage 32, a given amount of thermoplastic resin is dropped from the hot dispenser 42 onto the LD 12. The amount of thermoplastic resin to be dropped is controlled by controlling the compressed air to be introduced through the hose 45, e.g., by controlling the time of connection of the hose 45 to the compressed air source and/or the pressure of the compressed air in the compressed air source. Not only the control of the amount of thermoplastic resin to be dropped, but also the control of the viscosity of thermoplastic resin to be dropped is important. That is, it is necessary to control both the amount and viscosity of thermoplastic resin to be dropped so that the thermoplastic resin dropped from the hot dispenser 42 onto the LD 12 as shown by reference numeral 60 covers only the LD 12 and its periphery.

Because the stage 32 is heated at about 150° C., the thermoplastic resin 60 dropped onto the LD 12 spreads to the periphery of the LD 12 and solidifies. To accelerate the solidification of the thermoplastic resin 60, a cooling air may be sprayed from the nozzle 44 to the thermoplastic resin 60 spread. In the case that Staystick 383 is used as the thermoplastic resin 60, however, the spraying of the cooling air from the nozzle 44 is unnecessary because Staystick 383 dropped onto the LD 12 spreads to the periphery of the LD 12 and immediately solidifies in spite of the fact that the stage 32 is heated at about 150° C.

The heating temperature of the stage 32 is important in controlling the viscosity of the thermoplastic resin 60 dropped to adjust the spread range thereof, so that the temperature of the stage 32 is preferably set to about 150° C. If the temperature of the stage 32 is a low temperature such as room temperature, the thermoplastic resin 60 dropped does not spread, but immediately solidifies, so that a necessary sealing area cannot be covered with the thermoplastic resin 60.

According to the LD module 2 of this preferred embodiment, only the optical coupling portion between the LD 12 and the optical waveguide 10 is covered with the transparent silicone resin 58, and only the LD 12 and its periphery are covered with the thermoplastic resin 60. Accordingly, a residual stress in the thermoplastic resin 60 can be reduced. As a result, separation, cracking, etc. of the thermoplastic resin 60 can be prevented to thereby ensure the reliability of the LD 12. It is not preferable to cover the LD 12 and its periphery with only the transparent silicone resin 58, because the silicone resin 58 is insufficient in moisture resistance or the like, causing a problem that a long-term reliability of the LD 12 cannot be ensured.

Figure 5:
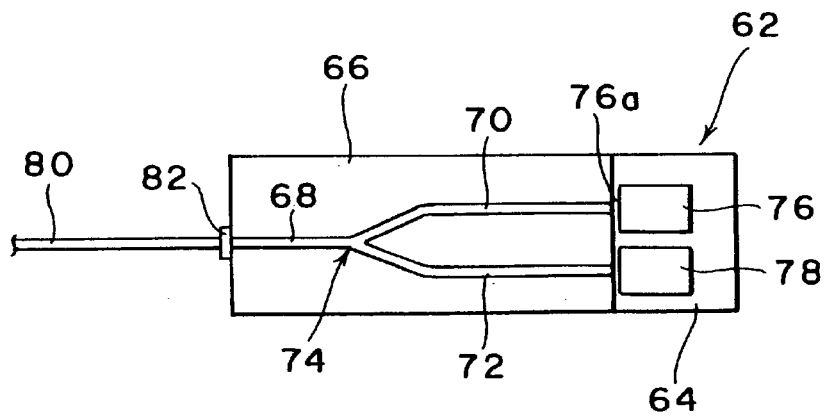
FIG. 5 is a plan view of an optical module for bidirectional transmission.

Referring to FIG. 5, there is shown a plan view of an optical module 62 for bidirectional transmission to which the resin sealing method according to the first preferred embodiment of the present invention is suitably applied. An $SiO_2$ glass layer 62 is formed on an Si substrate 64 by a CVD process, for example. Optical waveguides 68, 70, and 72 doped with germanium (Ge) or titanium (Ti), for example, are formed in the $SiO_2$ glass layer 66. The optical waveguide 68 is connected through a Y branch 74 to the optical waveguides 70 and 72. An optical fiber 80 inserted and fixed in a ring 82 formed of ruby or the like is bonded to an end of the optical waveguide 68 by an optical adhesive such as an ultraviolet-curing optical adhesive.

A laser diode (LD) 76 for transmission is mounted on the substrate 64 so as to be opposed to an end of the optical waveguide 70. The laser diode 76 has an excitation end 76a formed from a cleavage surface of a semiconductor. A photodiode (PD) 78 for reception is mounted on the substrate 64 so as to be opposed to an end of the optical waveguide 72. The distance between the end of the optical waveguide 70 and the laser diode 76 is set to about 50 m, and the distance between the end of the optical waveguide 72 and the photodiode 78 is also set to about 50 m.

In applying the resin sealing method to the optical module 62, the apparatus shown in FIG. 2 is used to cover an optical coupling portion between the LD 76 and the optical waveguide 70 and an optical coupling portion between the PD 78 and the optical waveguide 72 with a transparent resin such as a silicone resin to ensure an optical path. Then, a thermoplastic resin is dropped from the hot dispenser 42 onto the LD 76 and the PD 78 to seal them and their peripheries with the thermoplastic resin. Thus, the LD 76, the PD 78, and their peripheries only are sealed with the thermoplastic resin, so that a residual stress in the sealing resin can be reduced to thereby ensure a long-term reliability of the LD 76 and the PD 78.

Figure 6A:
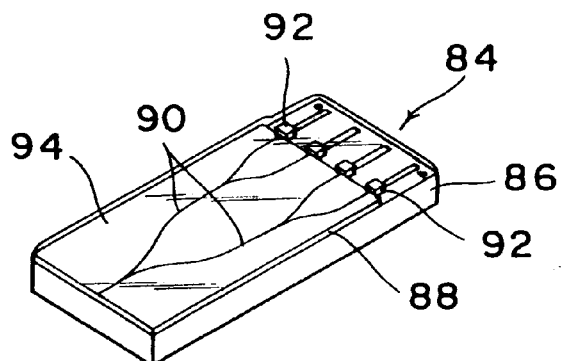
FIGS. 6A to 6D are perspective views showing a sealing process according to a second preferred embodiment of the present invention.

A sealing process according to a second preferred embodiment of the present invention will now be described with reference to FIGS. 6A to 6D. Referring to FIG. 6A, reference numeral 84 denotes an optical module before resin sealed. An $SiO_2$ glass layer 88 is formed on an Si substrate 86 by a CVD process, for example, and a plurality of optical waveguides 90 doped with germanium (Ge) or titanium (Ti), for example, are formed in the $SiO_2$ glass layer 88. A laser diode (LD) 92 is mounted on the Si substrate 86 so as to be opposed to an end of each optical waveguide 90.

Figure 6B:
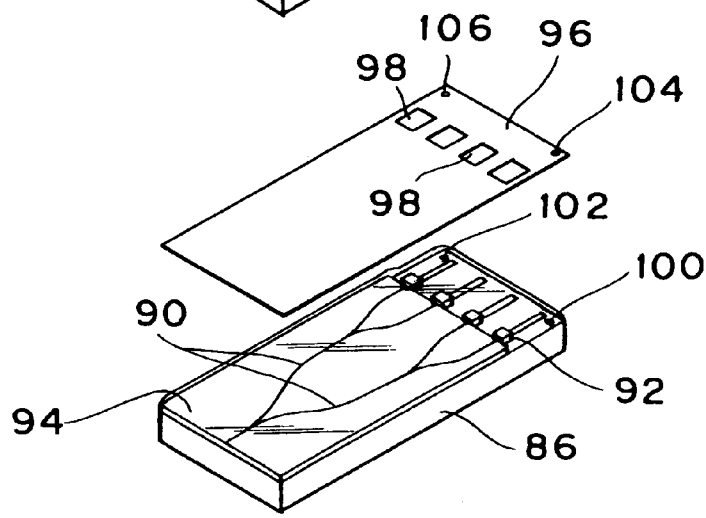

In this preferred embodiment, an ultraviolet-curing resin such as an acrylic ultraviolet-curing resin is used as the sealing resin. As shown in FIG. 6A, an adequate amount of acrylic ultraviolet-curing resin is dropped onto the LDs 92, and is next spread over the entire surface of the substrate 86 by using a spinner (not shown) as shown by reference numeral 94. Then, a mask 96 having a plurality of openings 98 respectively corresponding to the plural LDs 92 and their peripheries as shown in FIG. 6B is laid over the substrate 86 at a height of about 0.1 mm, and markers 100 and 102 of the substrate 86 and markers 104 and 106 of the mask 96 are respectively aligned with each other by using a commercially available mask aligner (not shown). The mask 96 may be formed by vapor deposition of aluminum or the like on a glass plate except the openings 98.

Figure 6C:
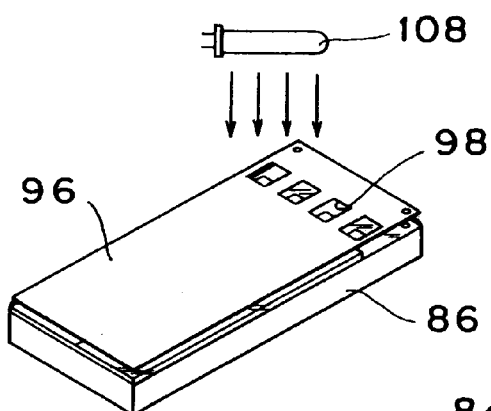
Figure 6D:
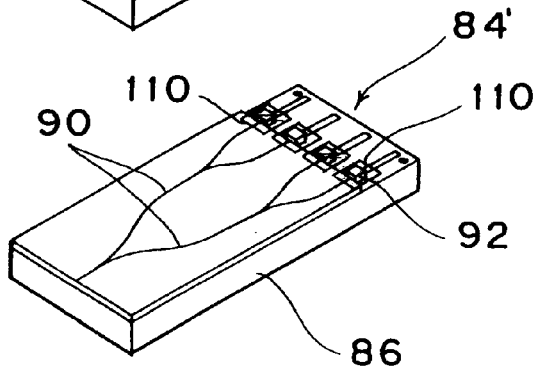

As shown in FIG. 6C, ultraviolet radiation from an ultraviolet radiation source 108 is directed through the mask 96 onto the resin 94 applied to the substrate 86. As a result, only a part of the resin 94 on the LDs 92 and their peripheries exposed to the openings 98 is cured by the ultraviolet radiation. For example, ultraviolet radiation having a wavelength of 350 nm is directed with a power of 3 joule/$cm^2$ Thereafter, the mask 96 is removed and the remaining uncured part of the resin 94 is next removed by an organic solvent such as acetone, thus sealing the LDs 92 with the cured resin as shown by reference numeral 110 in FIG. 6D, in which reference numeral 84' denotes the optical module after resin sealed. In this preferred embodiment, local resin sealing at plural positions on the same substrate can be performed at a time. Accordingly, this preferred embodiment is effective for improvement in mass productivity of an optical module with many optical elements mounted on a substrate.

According to the present invention, only an optical element and its periphery can be sealed with a resin, thereby reducing a residual stress in the sealing resin. Accordingly, cracking and separation of the sealing resin can be prevented, and a long-term reliability of the optical module can be ensured by a simple resin sealing method.

What is claimed is:

1. An optical module comprising:

a substrate;

an optical waveguide formed on and parallel to said substrate and having a first end;

an optical element mounted on said substrate for performing conversion between light and electricity, said optical element being mounted with a gap between said optical element and the first end of said optical waveguide, said gap being small enough for allowing an optical coupling between said optical element and the first end of said optical waveguide;

a transparent resin for covering at least said gap between the first end of said optical waveguide and said optical element; and a thermoplastic resin for covering only said optical element and its periphery including said transparent resin to seal said optical element.

2. An optical module according to claim 1, wherein said transparent resin is a silicone resin, and said thermoplastic resin is polyoxyether.

3. An optical module comprising:

a substrate;

an optical waveguide formed on and parallel to said substrate and having a first end;

an optical element mounted on said substrate for performing conversion between light and electricity, said optical element being mounted with a gap between said optical element and the first end of said optical waveguide, said gap being small enough for allowing an optical coupling between said optical element and the first end of said optical waveguide; and an ultraviolet-curing resin for covering only said optical element and its periphery including said gap between the first end of said optical waveguide and said optical element to seal said optical element.

4. An optical module according to claim 3, wherein said ultraviolet-curing resin is an acrylic ultraviolet-curing resin.

5. An apparatus comprising:

an optical waveguide formed on and parallel to a substrate and having a first end;

an optical element, mounted on said substrate, performing conversion between light and electricity, said optical element being mounted with a gap allowing an optical coupling between said optical element and the first end of said optical waveguide;

a transparent resin covering at least said gap between the first end of said optical waveguide and said optical element; and a thermoplastic resin covering said optical element and its periphery including said transparent resin to seal said optical element.

6. An apparatus according to claim 5, wherein said transparent resin is a silicone resin, and said thermoplastic resin is polyoxyether.

7. An apparatus comprising:

an optical waveguide formed on and parallel to a substrate and having a first end;

an optical element, mounted on said substrate, performing conversion between light and electricity, said optical element being mounted with a gap allowing for an optical coupling between said optical element and the first end of said optical waveguide; and an ultraviolet-curing resin covering said optical element and its periphery including said gap between the first end of said optical waveguide and said optical element to seal said optical element.

8. An apparatus according to claim 7, wherein said ultraviolet-curing resin is an acrylic ultraviolet curing resin.

* * * * *